United States Patent [19]
Takahashi

[11] Patent Number: 6,023,068
[45] Date of Patent: Feb. 8, 2000

[54] SEMICONDUCTOR DEVICE MANUFACTURING APPARATUS

[75] Inventor: Kazuo Takahashi, Kawasaki, Japan

[73] Assignee: Canon Kabushiki Kaisha, Tokyo, Japan

[21] Appl. No.: 08/968,865

[22] Filed: Nov. 5, 1997

Related U.S. Application Data

[63] Continuation of application No. 08/298,315, Sep. 1, 1994, abandoned, which is a continuation of application No. 07/889,974, May 29, 1992, abandoned.

[30] Foreign Application Priority Data

May 30, 1991 [JP] Japan ..................................... 3-153746
Apr. 17, 1992 [JP] Japan ..................................... 4-098061

[51] Int. Cl.[7] .................................................. H01L 21/30
[52] U.S. Cl. ......................................................... 250/492.2
[58] Field of Search ........................................ 250/492.2

[56] References Cited

U.S. PATENT DOCUMENTS

| | | | |
|---|---|---|---|
| 4,298,803 | 11/1981 | Matsuura et al. | 250/492.22 |
| 4,503,335 | 3/1985 | Takahashi | 250/548 |
| 4,538,069 | 8/1985 | Shambroom et al. | 250/491.1 |
| 4,659,225 | 4/1987 | Takahashi | 356/358 |
| 4,812,661 | 3/1989 | Owen | 250/492.2 |
| 4,874,954 | 10/1989 | Takahashi et al. | 250/548 |
| 5,050,111 | 9/1991 | Ayata et al. | 364/559 |
| 5,083,032 | 1/1992 | Suzuki | 250/492.2 |

*Primary Examiner*—Jack I. Berman
*Attorney, Agent, or Firm*—Fitxpstrick, Cella, Harper & Scinto

[57] ABSTRACT

An apparatus for semiconductor device manufacture is disclosed, which apparatus includes first and second, different exposure systems each for forming an image of a circuit pattern on a substrate coated with a photosensitive material, and a stationary member for supporting the first and second exposure systems.

17 Claims, 10 Drawing Sheets

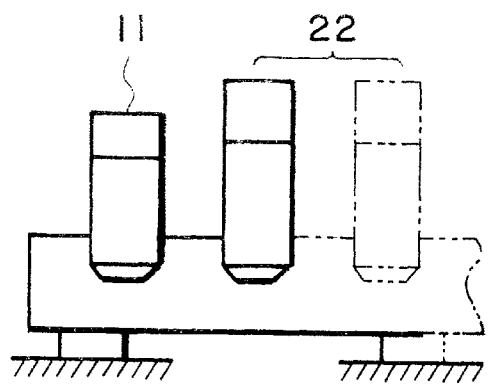
F I G. 4
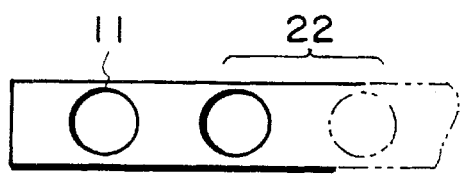
F I G. 5
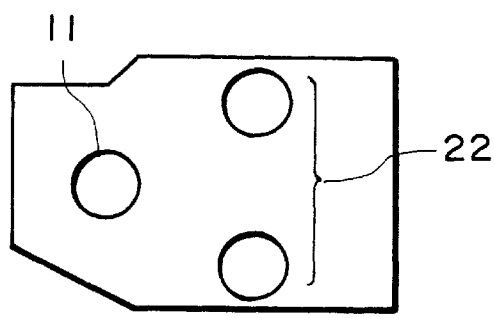
F I G. 6
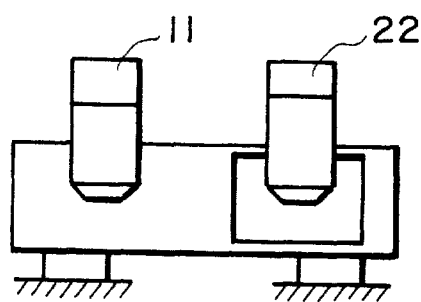
F I G. 7

SEMICONDUCTOR DEVICE MANUFACTURING APPARATUS

This application is a continuation of application Ser. No. 08/298,315, filed Sep. 1, 1994, which is a continuation of application Ser. No. 07/889,974, filed May 29, 1992, both now abandoned.

FIELD OF THE INVENTION AND RELATED ART

This invention relates to a semiconductor manufacturing apparatus for manufacturing semiconductor devices and, more particularly, to a semiconductor device manufacturing exposure apparatus.

Many types of exposure apparatuses have been proposed for the manufacture of semiconductor devices. These exposure apparatuses have respective characteristic performances but involve such inconveniences as described below.

For example, in an optical exposure apparatus, the critical resolving power and the depth of focus are limited by the wavelength of light used. Also, in designing a projection optical system, there is a problem of homogeneousness of a glass material used or a problem of machining precision. If the field size of exposure is made larger, it becomes more difficult to make the numerical aperture (NA) of the projection optical system larger.

In a reduction projection exposure apparatus (called a stepper) which is a prevailing exposure apparatus for the semiconductor device manufacture, in the trend of further miniaturization of a semiconductor device to be produced, even a small change in the projection magnification or the focal point position due to a change in pressure, temperature or humidity cannot be neglected.

On the other hand, with an electron beam exposure apparatus it is possible to draw a circuit pattern of a fine semiconductor device directly on a photosensitive material applied to a semiconductor substrate. However, it takes a long time to draw the circuit pattern and, therefore, such an apparatus cannot be easily used as a productive machine.

Also, exposure apparatuses using soft X-rays, synchrotron radiation (SOR), ion beams or the like include respective problems which are to be solved.

SUMMARY OF THE INVENTION

It is an object of the present invention to provide an improved semiconductor device manufacturing apparatus.

It is another object of the present invention to provide a semiconductor device manufacturing exposure apparatus by which degradation of positioning precision can be avoided without decreasing the productivity or increasing the cost.

In accordance with an aspect of the present invention, to achieve this object, a semiconductor device manufacturing exposure apparatus is provided by a combination of exposure systems each for exposing a certain area at once with synchrotron radiation, X-rays or laser light (as can be represented by an excimer laser) for forming a fine circuit pattern; or a combination of an exposure system for exposing a certain area at once with synchrotron radiation, X-rays or laser light (as can be represented by an excimer laser), with an exposure system for partially exposing a certain small area or a portion of a circuit pattern, or an electron beam, SOR X-ray beam or ion beam pattern drawing system with which a certain small area or a portion of a circuit pattern can be drawn directly on a photosensitive material on a semiconductor substrate without using a mask.

The proposed combination assures a semiconductor exposure apparatus particularly suitable for manufacture of a fine circuit as can be represented by DRAM or SRAM, and makes it possible to form an ultra-fine circuit which could not be formed by a single conventional exposure apparatus. Also, it has a satisfactory performance as a mass-productive machine.

In an exposure system using X-rays or synchrotron radiation as a light source, according to the present invention, a semiconductor substrate is usually processed within a vacuum. Also, in an electron beam pattern drawing system to be used in combination, a semiconductor substrate is processed within a vacuum. Thus, if a common vacuum chamber is used, then it is advantageously possible to reduce the evacuation time for evacuating the vacuum chamber after introduction/off-loading of the substrate.

The present invention may use a first optical exposure system comprising a projection exposure system which uses an excimer laser or g-line or i-line light from an ultra-high pressure Hg lamp as a light source, and a second exposure system comprising an electron beam direct pattern drawing system.

In a projection exposure system using an excimer laser or g-line or i-line light from an ultra-high pressure Hg lamp as a light source, a semiconductor substrate is processed in atmosphere. When an electron beam direct pattern drawing system is used as the second exposure system, if a vacuum chamber common to these exposure systems is provided to process the semiconductor substrate therein, then a stage system including a laser interferometer for controlling the positioning of the semiconductor substrate can be disposed in a vacuum and, as a result, it is possible to improve the positioning precision which otherwise might be changed due to a change in index of air. Further, if the first projection exposure system is included in a portion of the vacuum chamber, it is possible to avoid a change in projection magnification or focal point position of the projection optical system due to a change in pressure.

In the present invention, the problem of slow speed of direct drawing of a circuit pattern, of an electron beam direct pattern drawing apparatus, is solved by arranging so that only a fine-line portion of a circuit pattern is drawn by this system, rather than drawing the whole circuit pattern (including a thick-line pattern) with this system.

If in the present invention the same photosensitive material is used for the exposure process by an optical exposure system and for the direct drawing process with an electron beam, then a common step for photosensitive material application and a common step for development are assured to reduce the number of semiconductor substrate handling steps. This effectively reduces contamination and improves the productivity.

The electron beam direct drawing system of the present invention may be replaced by a scanning tunnel microscope (STM) microcircuit writing system which can form an ultra-fine circuit pattern by directly moving atoms through the STM method. On that occasion, an intermediate system for peeling a photosensitive material may be provided between the first and second exposure systems, such that with the second exposure system (STM microcircuit writing system) atoms in the photosensitive-material released portion of the semiconductor substrate may be moved in accordance with the shape of the circuit pattern.

The electron beam or STM microcircuit writing system may be used as a repairing system for defective devices.

On the other hand, there are other problems to be solved. An example of them is concerned with the handling of a semiconductor substrate to be exposed, within the apparatus. If the number of semiconductor substrate handling operations increases, it directly results in contamination or decreased productivity.

It is accordingly an object of the present invention to provide a semiconductor device manufacturing apparatus by which the number of semiconductor substrate handling operations between plural exposure systems can be reduced to suppress the contamination and to improve the productivity.

In accordance with an aspect of the present invention, to achieve this object, a semiconductor device manufacturing apparatus includes a plurality of exposure systems having different specifications and different performances, for printing a semiconductor device pattern on a semiconductor substrate, and a plurality of substrate holding stations for holding a semiconductor substrate at those positions corresponding to the exposure systems, respectively. Each substrate holding station includes a chuck for fixedly holding a semiconductor substrate through attraction, an alignment mechanism for bringing the surface of the semiconductor substrate, held by the chuck, into coincidence with the exposure plane of the corresponding exposure system, and a stage mechanism for moving the semiconductor substrate, held by the chuck, along the exposure plane. The substrate holding stations are exchangeable between the exposure systems.

Preferably, there may be provided a base table for supporting the stage mechanism, a common stage mechanism for moving the base table, and a rotating mechanism for rotationally moving the base table on the common stage mechanism. Also, there may be provided a chamber for placing each substrate holding station in a reduced-pressure ambience.

Further, one of the exposure systems may comprise a reduction projection exposure system and another exposure system may comprise an electron beam direct drawing system.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 4 is a schematic side view of an arrangement wherein a plurality of exposure systems are provided in one and the same apparatus along a straight line.

FIG. 5 is a schematic top plan view of the arrangement of FIG. 4.

FIG. 6 is a schematic top plan view of an arrangement wherein a plurality of exposure systems are provided in one and the same apparatus, concentrically.

FIG. 7 is a schematic view of an arrangement wherein only a semiconductor substrate processing portion of a second exposure system is equipped with a vacuum chamber.

DESCRIPTION OF THE PREFERRED EMBODIMENTS

Figure 1:
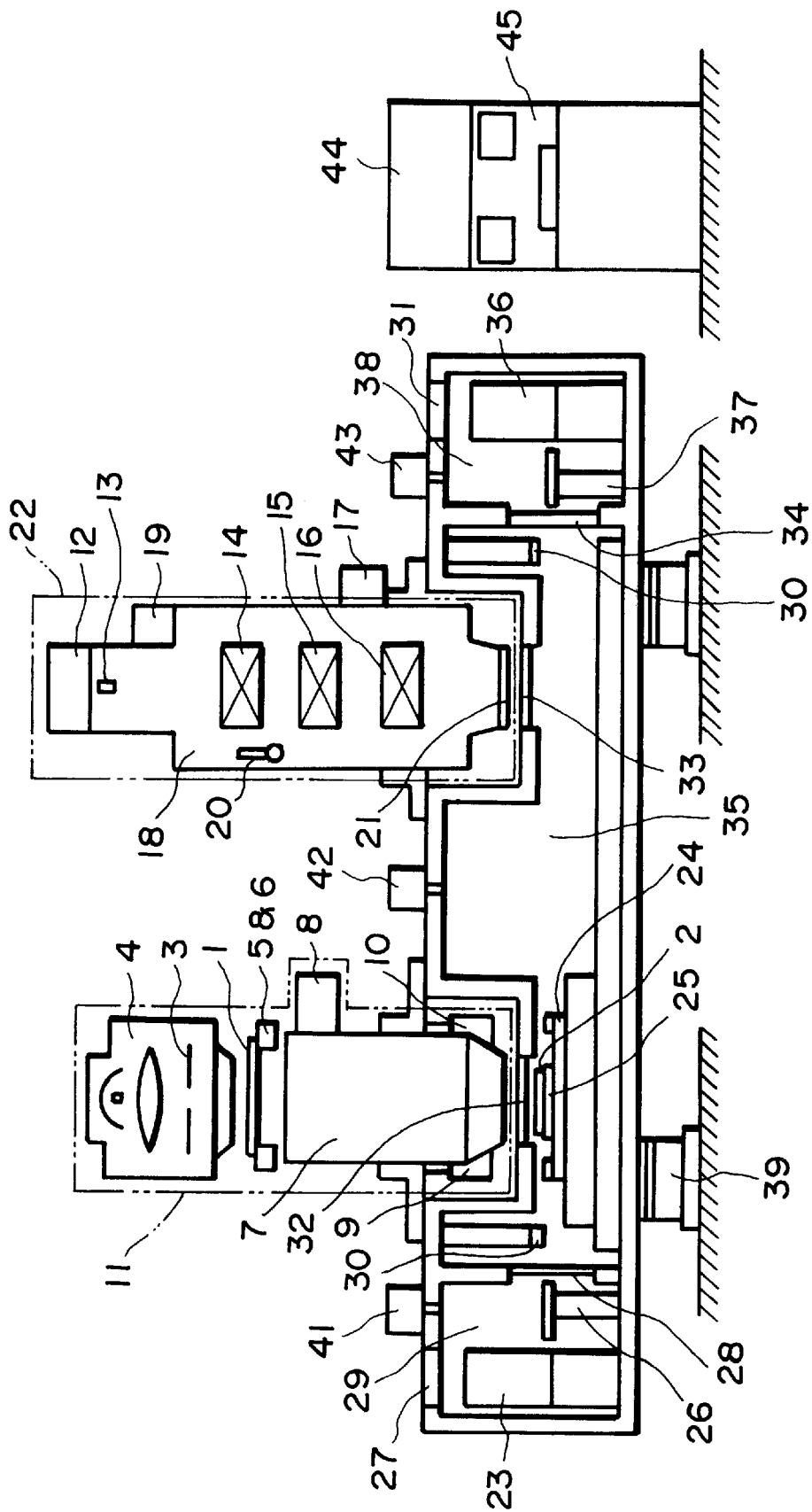
FIG. 1 is a schematic view of a semiconductor device manufacturing apparatus of an embodiment of the present invention.

FIG. 1 shows a semiconductor device manufacturing apparatus according to an embodiment of the present invention. This apparatus is used to form a fine circuit pattern for a semiconductor device on a semiconductor substrate coated with a photosensitive material. A glass substrate which provides a reticle (or a mask) 1 has a semiconductor circuit pattern.

A first, optical exposure system 11 is provided by: an illumination system 4 including a shutter 3, for printing the circuit pattern of the reticle on the photosensitive material on the semiconductor substrate 2; a reticle stage 5 for positioning and holding the reticle 1; an alignment mechanism 6; a projection optical system 7 for forming an image of the circuit pattern of the reticle as illuminated by the illumination optical system on the semiconductor substrate; an optical controlling mechanism 8 for controlling the magnification and/or the focal point position of the projection optical system; an alignment mechanism 9 for registering the projected image of the circuit pattern with a circuit pattern already formed on the semiconductor substrate; and a focusing mechanism 10 for correctly focusing the projected image of the circuit pattern on the semiconductor substrate.

A second, electron beam direct drawing exposure system 22 is provided by: a voltage source 12 and an electron gun 13 for producing an electron beam; an electron lens 14 for shaping the electron beam; a deflection control mechanism 15 for controlling the direction of the electron beam; a focus control mechanism 16 for controlling the focus of the electron beam; a control mechanism 17 for the on/off control of the electron beam in accordance with programmed conditions; a beam column 18 for organically connecting these components so as to assure efficient impingement of the electron beam upon a surface to be irradiated; a vacuum pump 19 for providing a vacuum to the passageway of the electron beam within the beam column; a vacuum gauge 20 for measuring the vacuum level; and an openable/closable partition 21 for retaining the vacuum level in the beam column. The second, direct drawing exposure system is juxtaposed to the first, optical exposure system (see FIG. 9).

The apparatus is further equipped with: a cassette 23 for keeping semiconductor substrates therein; a substrate conveying mechanism 26 for taking a semiconductor substrate out of the cassette and for placing, after prealigning it, the semiconductor substrate on a substrate chuck 25 of an exposure station 24 which is below the first, optical exposure system; and a first chamber 29 for accommodating these components and having an openable/closable partition 27 for introduction/off-loading of the cassette and another openable/closable partition 28 for feeding the prealigned semiconductor substrate toward the next station.

The exposure station includes a substrate chuck for holding a semiconductor substrate and being movable under the first, optical exposure system and the second, direct drawing system. More particularly, it is movable along the X, Y and Z axes for allowing exposure of the whole surface of the semiconductor substrate and, also, it is rotationally movable about the X, Y and Z axis. The position thereof is measured by a laser interferometer 30.

A second chamber 35 accommodates this exposure station therein. The second chamber is common to the first and second exposure systems. It has an opening with a transparent partition 32 at its top for retaining the vacuum against the first exposure system; an openable/closable partition (opening) 33 for retaining the vacuum against the second exposure system; and an openable/closable partition 34 for introduction/off-loading of a semiconductor substrate.

Also, there are provided a cassette 36 for temporarily storing an "exposed" substrate; a substrate conveying mechanism having a substrate moving mechanism 37 for moving a substrate on the substrate chuck into the cassette, and for taking a substrate out of the second chamber and for storing the substrate into the cassette; and a third chamber for accommodating these components and having an opening for off-loading a substrate from the second chamber and an openable/closable partition 31 for introduction and off-loading of the cassette.

The first and third chambers and the second chamber are isolated with respect to vibration, and the second chamber and the first and second exposure systems are mounted on an anti-vibration system 39.

The first, second and third chambers are evacuated independently of each other by means of separate vacuum pumps 41, 42 and 43, respectively.

The present embodiment is further equipped with a control device 44 for controlling the first and second exposure systems, and a console system 45 for supplying instructions to the apparatus and for monitoring the operational state of the apparatus.

As a second embodiment, the first, optical exposure system of the first embodiment may be replaced by one of a proximity simultaneous exposure system using ultraviolet rays as an exposure light source, an X-ray unit-magnification exposure system and an X-ray reduction exposure system.

As a third embodiment, the second, electron beam direct drawing exposure system of the first or second embodiment may be replaced by one of an exposure system adapted for partial exposure of a small area or a portion of a circuit pattern; an electron beam, SOR X-ray beam or ion beam drawing system capable of directly drawing a small area or a portion of a circuit pattern on a photosensitive material on a semiconductor substrate without using a mask; and an STM microcircuit writing system for directly moving atoms through the STM method to form an ultra-fine circuit pattern.

Figure 2:
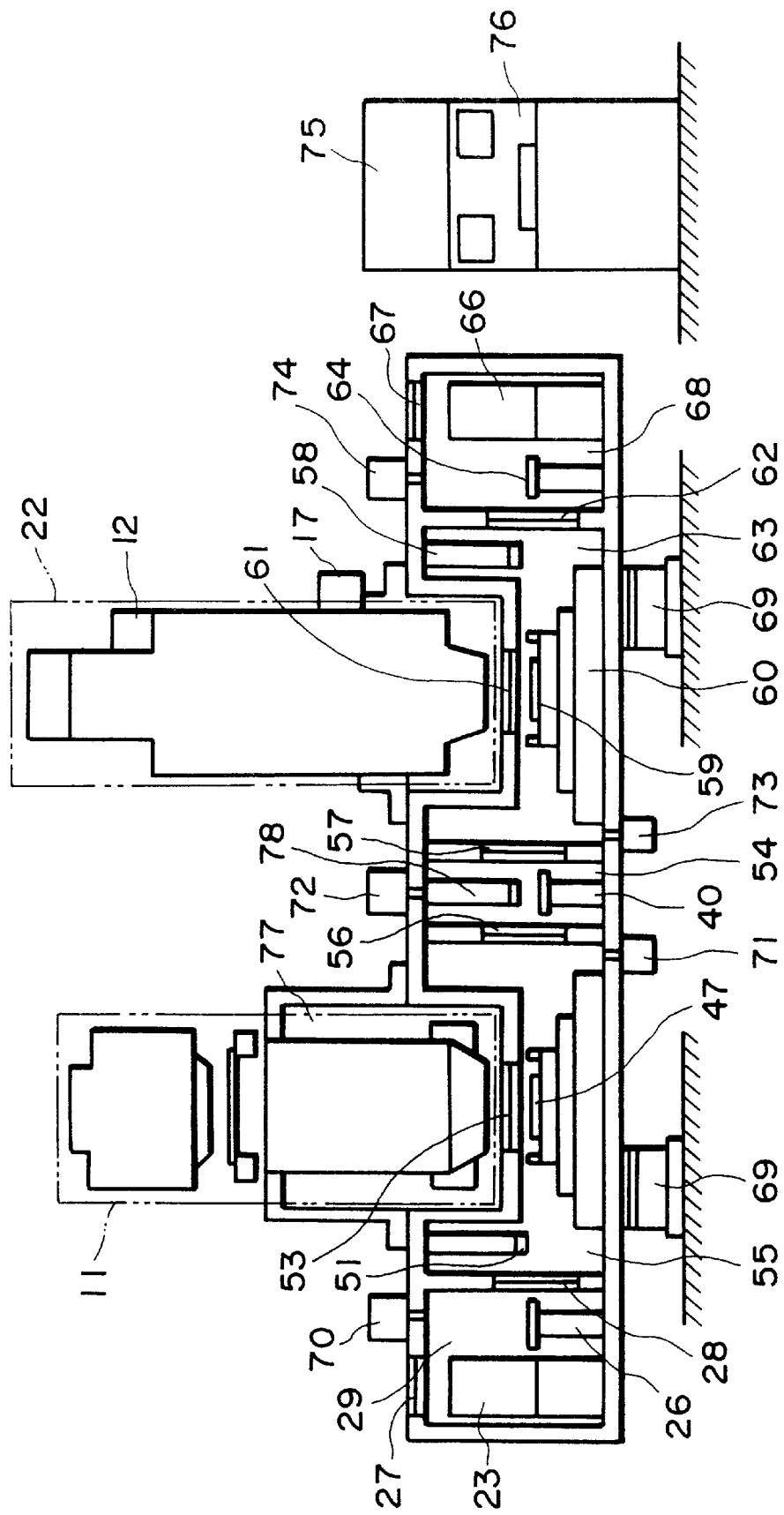
FIG. 2 is a schematic view of a semiconductor device manufacturing apparatus of another embodiment of the present invention.

FIG. 2 shows a fourth embodiment of the present invention.

A glass substrate which provides a reticle has a semiconductor circuit pattern.

A first, optical exposure system 11 is provided by: an illumination system including a shutter, for printing the circuit pattern of the reticle on the photosensitive material on the semiconductor substrate; a reticle stage for positioning and holding the reticle; an alignment mechanism; a projection optical system for forming an image of the circuit pattern of the reticle as illuminated by the illumination optical system on the semiconductor substrate; an optical controlling mechanism for controlling the magnification and/or the focal point position of the projection optical system; an alignment mechanism for registering the projected image of the circuit pattern with a circuit pattern already formed only the semiconductor substrate; and a focusing mechanism for correctly focusing the projected image of the circuit pattern on the semiconductor substrate.

A second, direct drawing exposure system 22 is provided by: a voltage source and an electron gun for producing an electron beam; an electron lens for shaping the electron beam; a deflection control mechanism for controlling the direction of the electron beam; a focus control mechanism for controlling the focus of the electron beam; a control mechanism for the on/off control of the electron beam in accordance with programmed conditions; a beam column for organically connecting these components so as to assure efficient impingement of the electron beam upon a surface to be irradiated; a vacuum pump for providing a vacuum to the passageway of the electron beam within the beam column; a vacuum gauge for measuring the vacuum level; and an openable/closable partition for retaining the vacuum level in the beam column. The second, direct drawing exposure system is juxtaposed to the first, optical exposure system.

The apparatus is further equipped with: a cassette 23 for keeping semiconductor substrates therein; a substrate conveying mechanism 47 for taking a semiconductor substrate out of the cassette and for placing, after prealigning it, the semiconductor substrate on a substrate chuck 47 of a first exposure station which is below the first, optical exposure system; and a first chamber 29 for accommodating these components and having an openable/closable partition 27 for introduction/off-loading of the cassette and another openable/closable partition 28 for feeding the prealigned semiconductor substrate toward the next station.

The first exposure station 46 includes a substrate chuck for holding a semiconductor substrate. The substrate chuck is movable under the first, optical exposure system 11. More particularly, it is movable along the X, Y and Z axes for allowing exposure of the whole surface of the semiconductor substrate and, also, it is rotationally movable about the X, Y and Z axes. The position thereof is measured by a laser interferometer 51.

A second chamber 55 accommodates the first exposure station therein. It has an opening 52 with a transparent partition at its top for retaining the vacuum against the first exposure system; and an openable/closable partition 53 for introduction/off-loading of a semiconductor substrate.

Further, there are provided a substrate conveying mechanism 40 for moving an "exposed" substrate to the second exposure station: and a third chamber 54 for accommodating this and having openings 56 and 57 at its opposite sides, for introduction/off-loading of a substrate.

A second exposure station 60 has a substrate chuck 59 for holding a substrate and being movable under the second, direct drawing exposure system 22. More specifically, it is movable along the X, Y and Z axes for allowing exposure of the whole surface of the semiconductor substrate and, also, it is rotationally movable about the X, Y and Z axes. The position thereof is measured by a laser interferometer 58.

A fourth chamber 63 accommodates the second exposure station and has at its top an opening 61 to the second exposure system and another opening 62 for introduction/off-loading of a semiconductor substrate.

Further, there are provided a substrate conveying mechanism 64 for taking a substrate from the substrate chuck of the second exposure station in the fourth chamber and storing it into the cassette, and a fifth chamber for accommodating this mechanism and having an openable/closable partition 67 for introduction/off-loading of the cassette 66.

The first, third and fifth chambers and the second and fourth chambers are isolated with respect to vibration, and the second chamber and the first and second exposure systems are mounted on an antivibration system 69.

The first to fifth chambers are evacuated independently of each other by means of separate vacuum pumps 70, 71, 72, 73 and 74, respectively.

The present embodiment is further equipped with a control device 75 for controlling the first and second exposure systems, and a console system 76 for supplying instructions to the apparatus and for monitoring the operational state of the apparatus. A laser interferometer 77 for measuring the positional relationship between the first and second exposure stations may be provided in the third chamber.

Figure 8:
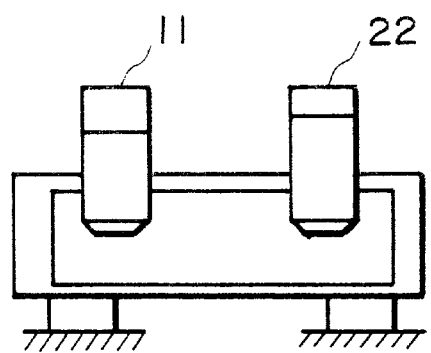
FIG. 8 is a schematic view of an arrangement wherein first and second exposure systems are equipped with a common vacuum chamber.

As a fifth embodiment, the first, optical exposure system of the fourth embodiment may be replaced by one of a proximity simultaneous exposure system using ultraviolet rays as an exposure light source, an X-ray unit-magnification exposure system and an X-ray reduction exposure system. Such an optical exposure system may not always need use of a vacuum for the exposure process and, on that occasion, a common vacuum chamber may be used only for the semiconductor substrate processing portions, such as shown in FIG. 8.

As a sixth embodiment, the second, electron beam direct drawing exposure system of the fourth or fifth embodiment may be replaced by one of an exposure system adapted for partial exposure of a small area or a portion of a circuit pattern; an electron beam, SOR X-ray beam or ion beam drawing system capable of directly drawing a small area or a portion of a circuit pattern on a photosensitive material on a semiconductor substrate without using an mask; and a STM microcircuit writing system for directly moving atoms through the STM method to form an ultra-fine circuit pattern.

Figure 3:
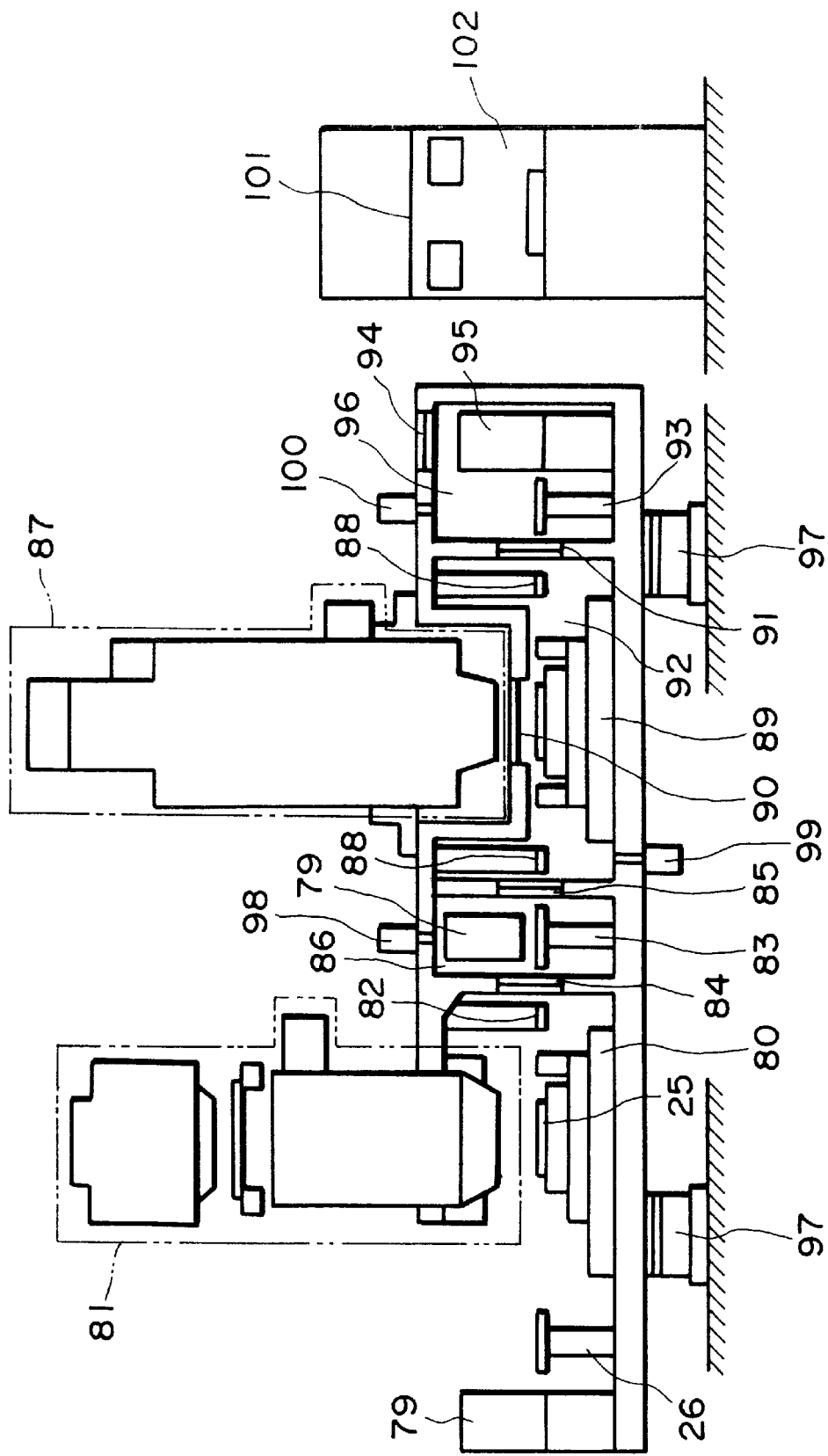
FIG. 3 is a schematic view of a semiconductor device manufacturing apparatus of a further embodiment of the present invention.

FIG. 3 shows a seventh embodiment of the present invention.

A glass substrate which provides a reticle (or a mask) has a semiconductor circuit pattern.

A first, optical exposure system 11 is provided by: an illumination system including a shutter, for printing the circuit pattern of the reticle on the photosensitive material on the semiconductor substrate; a reticle stage for positioning and holding the reticle, an alignment mechanism; a projection optical system for forming an image of the circuit pattern of the reticle as illuminated by the illumination optical system on the semiconductor substrate; an optical controlling mechanism for controlling the magnification and/or the focal point position of the projection optical system; an alignment mechanism for registering the projected image of the circuit pattern with a circuit pattern already formed on the semiconductor substrate; and a focusing mechanism for correctly focusing the projected image of the circuit pattern on the semiconductor substrate.

A second, electron beam direct drawing exposure system 22 is provided by: a voltage source and an electron gun for producing an electron beam: an electron lens for shaping the electron beam; a deflection control mechanism for controlling the direction of the electron beam; a focus control mechanism for controlling the focus of the electron beam; a control mechanism for the on/off control of the electron beam in accordance with programmed conditions; a beam column for organically connecting these components so as to assure efficient impingement of the electron beam upon a surface to be irradiated; a vacuum pump for providing a vacuum to the passageway of the electron beam within the beam column; a vacuum gauge for measuring the vacuum level; and an openable/closable partition for retaining the vacuum level in the beam column. The second, direct drawing exposure system is juxtaposed to the first, optical exposure system 11 (see FIG. 7).

The apparatus is further equipped with: a cassette 79 for keeping semiconductor substrates therein; and a substrate conveying mechanism 26 for taking a semiconductor substrate out of the cassette and for placing, after prealigning it, the semiconductor substrate on a substrate chuck 25 of a first exposure station 80 which is below the first, optical exposure system.

The first exposure station includes a substrate chuck for holding a semiconductor substrate and being movable under the first, optical exposure system 81. More particularly, it is movable along the X, Y and Z axes for allowing exposure of the whole surface of the semiconductor substrate and, also, it is rotationally movable about the X, Y and Z axes. The position thereof is measured by a laser interferometer 82.

A first chamber 86 accommodates therein a substrate conveying mechanism 83 for moving an "exposed" substrate to the second exposure station as well as a cassette for storing substrates therein, and it has openable/closable openings 84 and 85 at its opposite sides for introduction/off-loading of a substrate.

A second exposure station 89 has a substrate chuck for holding a substrate and being movable under the second, direct drawing exposure system 87. More specifically, it is movable along the X, Y and Z axes for allowing exposure of the whole surface of the semiconductor substrate and, also, it is rotationally movable about the X, Y and Z axes. The position thereof is measured and controlled by a laser interferometer 88.

A second chamber 92 accommodates the second exposure station and has at its top an opening 90 to the second exposure system and another opening 91 for introduction/off-loading of a semiconductor substrate.

Further, there are provided a substrate conveying mechanism 93 for taking a substrate from the substrate chuck of the second exposure station in the second chamber and storing it into the cassette, and a third chamber for accommodating them and having an openable/closable partition for introduction of a substrate from the second chamber as well as another openable/closable partition 94 for introduction/off-loading of the cassette 95.

The first and third chambers and the second chamber are insulated with respect to vibration, and the second chamber and the first and second exposure systems are mounted on an anti-vibration system 97, The first to third chambers are evacuated independently of each other by means of separate vacuum pumps 98, 99 and 100, respectively.

The present embodiment is further equipped with a control device 101 for controlling the first and second exposure systems, and a console system 102 for supplying instructions to the apparatus and for monitoring the operational state of the apparatus.

Figure 9:
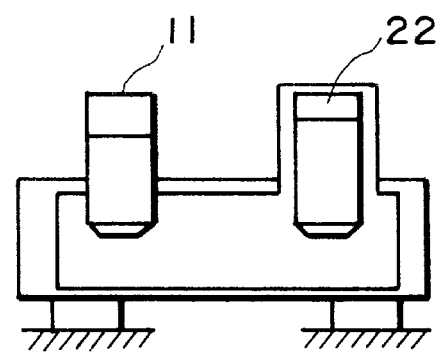
FIG. 9 is a schematic view of an arrangement wherein a second exposure system as a whole is placed within a common vacuum chamber.
Figure 10:
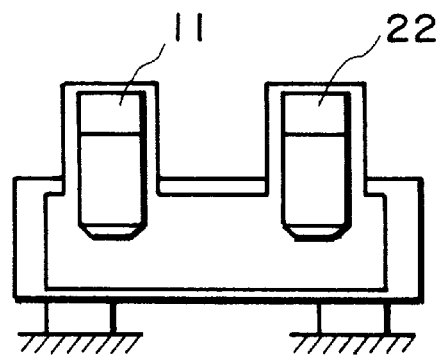
FIG. 10 is a schematic view of an arrangement wherein first and second exposure systems as a whole are placed within a vacuum chamber.

As an eighth embodiment, as shown in FIG. 9, a chamber 77 may be provided to surround the first exposure system and this chamber may be arranged to be a vacuum chamber. Further, on that occasion, the projection optical system and the reticle stage system may by disposed within the vacuum chamber 77.

In the foregoing embodiments, description has been made of examples wherein two exposure systems are incorporated into one and the same apparatus. However, exposure systems of a number corresponding to the semiconductor substrate processing ability of each exposure system may be incorporated into one and the same apparatus.

FIG. 4 shows the manner of disposing a plurality of exposure systems along a line. FIG. 5 is a top plan view thereof.

FIG. 6 shows an example wherein a plurality of exposure systems are disposed concentrically.

Now, these embodiments will be described in more detail.

In the first embodiment, in FIG. 1 the cassette 23 having kept therein semiconductor substrates with photosensitive coatings is introduced through the openable/closable partition 27 onto the substrate conveying device in the first vacuum chamber. After closing the partition 27, the first vacuum chamber is evacuated by means of the vacuum pump 41. Here, the partition 28 is closed before opening the partition 27, such that the gas-tightness with the second vacuum chamber 35 is maintained.

The vacuum level in the first vacuum chamber is monitored by a vacuum gauge (not shown). After a predetermined level is established, the partition 28 is opened and a semiconductor substrate is taken out of the cassette by means of the substrate conveying mechanism 26. After prealigning it, it is placed on the substrate chuck 25 of the exposure station 24 in the second vacuum chamber.

The exposure station which can be controlled in response to a signal from the laser interferometer 30 moves the substrate to be exposed to a site below the first exposure system. Then, the positioning operation as well as the autofocusing operation and the alignment operation are carried out, and the exposure operation starts.

When the first exposure system is provided by a system similar to a stepper having a reduction projection optical system, the step-and-repeat operation is effected to each exposure zone of the substrate while, on the other hand, the positioning operation as well as the autofocusing operation and the alignment operation are carried out. Here, the focus position information and/or the alignment position information of each shot (zone) is memorized into a memory of the control device 44, which controls the system.

After a rough circuit pattern is printed, in the first exposure station, on the photosensitive material on the semiconductor substrate, the exposure station moves to a site below the second exposure system (in this example, the electron beam direct drawing system) and it is positioned thereat. Here, the position of the exposure station may be corrected by using the focus position information or the alignment information for each shot (zone) having been memorized into the control device. If this is done, then, in the direct drawing with an electron beam in the second exposure system, it is not always necessary to execute the autofocusing operation or the alignment operation for each shot (zone) and, therefore, it is possible to increase the throughput.

Further, in this embodiment two laser interferometers 30 are provided at the left side of the first exposure system and the right side of the second exposure system, for control of the exposure station. This is for the correction of any error due to a thermal change of the exposure station. It is not always necessary to use the two at these sides.

Figure 11:
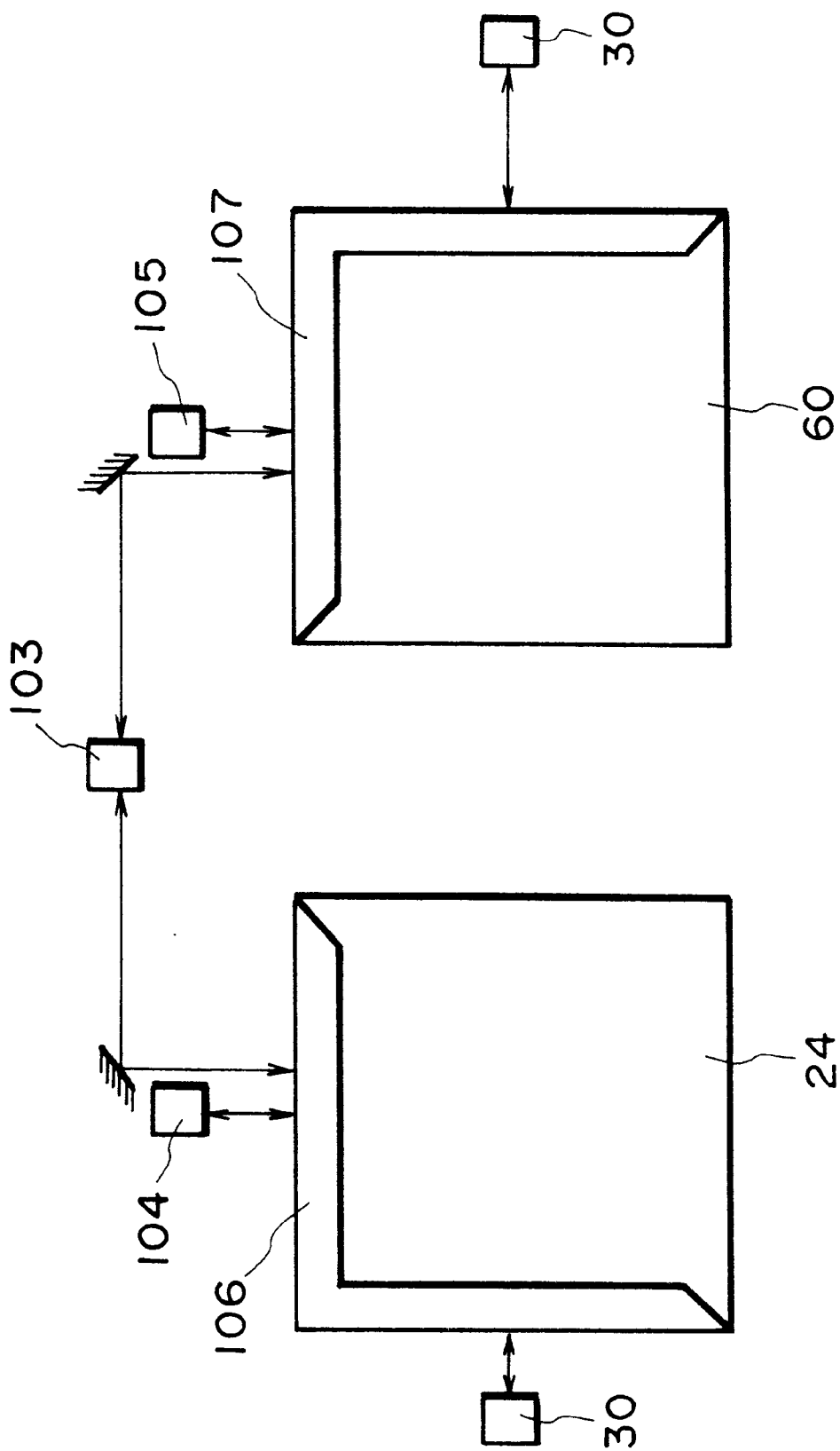
FIG. 11 is a schematic view of the structure of a laser interferometer (Y-axis measurement).

FIG. 1 is a front view. If an X axis of a coordinate is laid along the horizontal direction as viewed in FIG. 1, an additional laser interferometer or interferometers may be provided with respect to the Y-axis direction which is perpendicular to the sheet of the drawing. On that occasion, unless a reference mirror (106 or 107) of the laser interferometer disposed on the exposure station has a length bridging between the first and second exposure systems, it may not be possible to measure the Y-axis coordinate of the exposure station through the laser interferometer 104. However, such a problem can be solved by providing a separate laser interferometer 103 between the first and second exposure systems, as shown in FIG. 11.

When the second exposure system is provided by an electron beam direct drawing system and if a high exposure energy is available, it is not always necessary to stop the second exposure station for the exposure process. In any event, after being exposed with the second exposure system, the semiconductor substrate is conveyed by the substrate conveying mechanism 37 through the openable/closable partition 34 into the substrate container cassette 31. Here, the third chamber is maintained at a vacuum, by means of the vacuum pump 43.

When all the semiconductor substrates contained in the cassette 23 are conveyed by the conveying mechanism into the third chamber, the partition 28 is closed promptly. This ensures exchangeability of the cassette with a fresh one containing fresh semiconductor substrates.

On the other hand, the partition 34 is closed simultaneously with the off-loading of the last semiconductor substrate from the second chamber. If, at this moment, the inside of the first chamber is maintained at a vacuum, then it is possible to open the partition 28 to introduce a substrate onto the exposure station to start the exposure process. Simultaneously, the openable/closable partition 31 may be opened to take out the cassette, containing those substrates to which the exposure process has completed. The third chamber from which the cassette has been taken out, is promptly evacuated by means of the vacuum pump 43, and the partition 34 is opened for reception of "exposed" substrates.

Through repetition of these operations, the exposure process of semiconductor substrates is effected. If many fine circuit patterns are to be printed and the substrate processing speed of the second exposure system is lower than that of the first exposure system, a plurality of second exposure systems of a number comparable to the substrate processing speed of the first exposure system may be used such as shown in FIG. 4. On that occasion, within the second chamber there may be provided an exposure station operable below the first exposure system and, additionally, a separate exposure station operable below the second exposure system. Also, a substrate conveying mechanism may be added to transfer a substrate from the first exposure station to the second exposure station. This effectively increases the throughput.

Further, it is not always necessary that all the second exposure systems be of the same type. As an example, a first exposure system may be used to process a rough pattern and one of the second exposure systems may be used to process a fine pattern while a different one of the second exposure systems may be used to process a more fine pattern.

The exposure system of the fourth embodiment is essentially of the same structure as in the first embodiment. However, in this embodiment, for processing semiconductor substrates, independent vacuum chambers are used and, also, a laser interferometer 78 is provided to measure the positional relationship of the exposure stations which operate under respective exposure systems. In this embodiment, due to the independent vacuum chamber structure, advantageously the substrate can be processed independently. While the cost will increase to some extent as compared with the first embodiment, even if a portion of any exposure system or a portion of the substrate processing function is disordered, it is possible to continue the operation of any operable exposure system. Also, the maintenance can be made while sequentially stopping the functional portions.

The seventh embodiment shown in FIG. 3 has a structure for a case where a semiconductor substrate may not necessarily be processed in a vacuum, and it operates essentially in the same manner as the first embodiment. An important feature of this embodiment resides in that the first chamber is provided between the first and second exposure systems; that the cassette for storing semiconductor substrates exposed with the first exposure system, is provided; and that the laser interferometer 88 (at the left side of the second exposure system) is provided to relatively measure the positional relationship between the first and second exposure stations.

As described above, by incorporating exposure systems of different performances and specifications into one and the same apparatus while retaining their advantageous features, it is possible to compensate for the disadvantages of respective exposure systems. Also, while in an optical exposure system using, for example, deep UV rays or an excimer laser, the projection magnification or the focal point position of a projection optical system is changeable due to a change in index of air such as pressure, temperature or humidity, it is possible to avoid such an undesirable shift by disposing the projection optical system within a vacuum chamber.

Further, while a stage system for the positioning of a semiconductor substrate involves a problem that the measurement precision of a laser interferometer decreases with a change in index of the air, resulting in a registration error, such a problem can be solved by disposing the substrate processing system including the stage and the laser interferometer within a vacuum chamber.

Still further, in an electron beam direct drawing system, the drawing speed is low. In some embodiments of the present invention, however, such an electron beam direct drawing system is used only for the drawing of a portion of a semiconductor circuit pattern. As a result, the slow drawing speed can be compensated for while, on the other hand, the mass production of semiconductor devices each having a very fine pattern which might not be resolved by an optical exposure system, is assured.

If different exposure systems are used separately to execute the exposure process of the same semiconductor substrate, a large number of substrate handling operations are necessary to transfer the substrate between these exposure systems. This directly leads to the problem of contamination. In some embodiments of the present invention, at least two exposure systems are disposed in juxtaposition within one and the same apparatus to make the length of the substrate conveyance path minimum. Also, all the the substrate processing is effected within a vacuum chamber. By this, the problem of contamination can be avoided.

Figure 12:
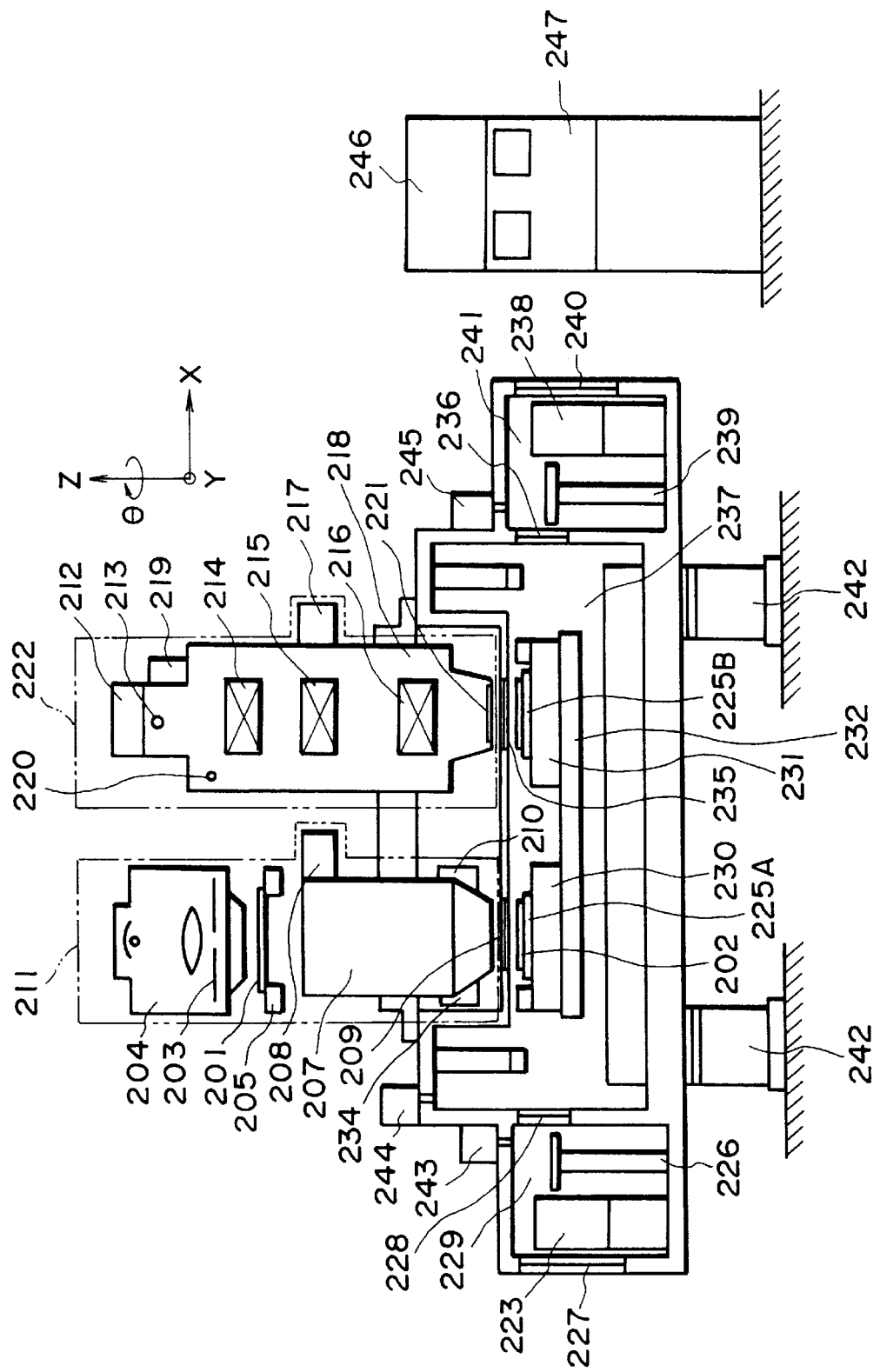
FIG. 12 is a schematic and sectional view of a semiconductor device manufacturing apparatus according to another embodiment of the present invention.

FIG. 12 shows a semiconductor device manufacturing apparatus according to an embodiment of the present invention, which is adapted to form a fine circuit pattern for a semiconductor device on a semiconductor substrate coated with a photosensitive material. In the drawing, denoted at 201 is a reticle or a mask (hereinafter, simply referred to as a "reticle") comprising a glass plate having a semiconductor circuit pattern. Denoted at 211 is a first, optical exposure system for exposing each shot area (zone) of a photosensitive layer on a semiconductor substrate 202 with exposure light passed through the reticle 201.

The first exposure system includes an illumination optical system 204 for projecting the exposure light to the reticle 201 and having a shutter 203 for controlling the amount of exposure; a reticle stage 205 for positioning the reticle 201 held thereon; and a projection optical system 207 for forming in a reduced scale an image of the circuit pattern of the reticle 201, illuminated with the exposure light from the illumination optical system 204, upon a particular shot area of the semiconductor substrate 202.

Desirably, the first exposure system 211 may be equipped with a detecting system 208 for the control of the magnification and/or the focal point position of the projection optical system 207; an alignment detecting system 209 for detecting an alignment error of the semiconductor substrate with respect to the reticle 201; and a focus detecting system 210 for correctly focusing the image of the circuit pattern, projected by the projecting optical system 207, upon the semiconductor substrate 202.

Denoted at 222 is a direct drawing exposure system juxtaposed to the first exposure system 211. The second, direct drawing exposure system 222 includes a voltage source 212 for causing an electron gun 213 to produce an electron beam; an electron lens for shaping the electron beam; a deflection controller 215 for controlling the direction of the electron beam; a focus controller 216 for controlling the focus of the electron beam; and a beam column 218 for assuring efficient impingement of the electron beam upon a surface to be irradiated.

Additionally, the second exposure system may be equipped with a control mechanism 217 for the on/off control of the electron beam in accordance with programmed conditions; a vacuum pump 219 for providing a vacuum to the electron beam passage in the beam column 218; a vacuum gauge for measuring the vacuum level in the beam column 218; and an openable/closable partition 221 for maintaining the vacuum level in the beam column 218.

An exposure station 230 is disposed below the first exposure system 211, while an exposure station 231 is disposed below the second exposure system 222. The exposure stations 230 and 231 each is adapted to allow movement of a semiconductor substrate 202 along the X and Y axes, perpendicular to the optical axis of the exposure system, so as to assure the exposure of the whole surface of the semiconductor substrate 202, and along the Z axis parallel to the optical axis of the exposure system. Also, it is adapted to allow rotational motion of the substrate in the θ direction about the Z axis. Further, each exposure station is equipped with a mechanism for bringing the surface of the semiconductor substrate into coincidence with the exposure plane (image plane) of the corresponding exposure system, as well as a substrate chuck 225A or 225B for holding the semiconductor substrate.

A turntable 232 is rotatable in a horizontal plane (X-Y plane), and it carries thereon the exposure stations 230 and 231. The turntable 232 is mounted on a stage 233 which has a stroke sufficient to assure the exposure of the whole surface of a semiconductor substrate and which is movable along the X-axis and Y-axis directions. These components are accommodated in a chamber 237 which has at its top an opening with a transparent partition 234 for retaining an inside reduced pressure (vacuum) ambience against the first exposure system 211; an opening with a partition 235 for retaining an inside reduced pressure (vacuum) ambience against the second exposure system 222; and an openable/closable partition 236 for introduction or off-loading of a semiconductor substrate.

A cassette 223 accommodates semiconductor substrates therein. A substrate conveying mechanism 226 is adapted to prealign a semiconductor substrate, taken out of the cassette 223, and to place the prealigned substrate on the substrate chuck 225 of the exposure station below the optical exposure system 211. These components are accommodated in a chamber 229 which has an openable/closable partition 227 for introduction/off-loading of the cassette 223, and an openable/closable partition 228 for feeding a prealigned substrate to the exposure station.

A cassette 238 is provided to temporarily store an "exposed" semiconductor substrate 202. A chamber 241 accommodates therein a substrate conveying mechanism 239 for moving a substrate 202 from the chuck 225 into the cassette 238, and it has an opening 236 for feeding a substrate out of the chamber 237 as well as an openable/closable partition 240 for introduction/off-loading of the cassette 238.

The chambers 229 and 241 and the chamber 237 are isolated with respect to vibration. The chamber 237 and the exposure systems 211 and 222 are mounted on anti-vibration systems 242. The chambers 229, 237 and 241 can be evacuated independently of each other by means of separate vacuum pumps 243, 244 and 245, respectively.

This embodiment is further equipped with a control device 246 for controlling the exposure systems 211 and 222, and a console system 247 for supplying instructions to the apparatus and for monitoring the operative state of the apparatus.

Figure 13:
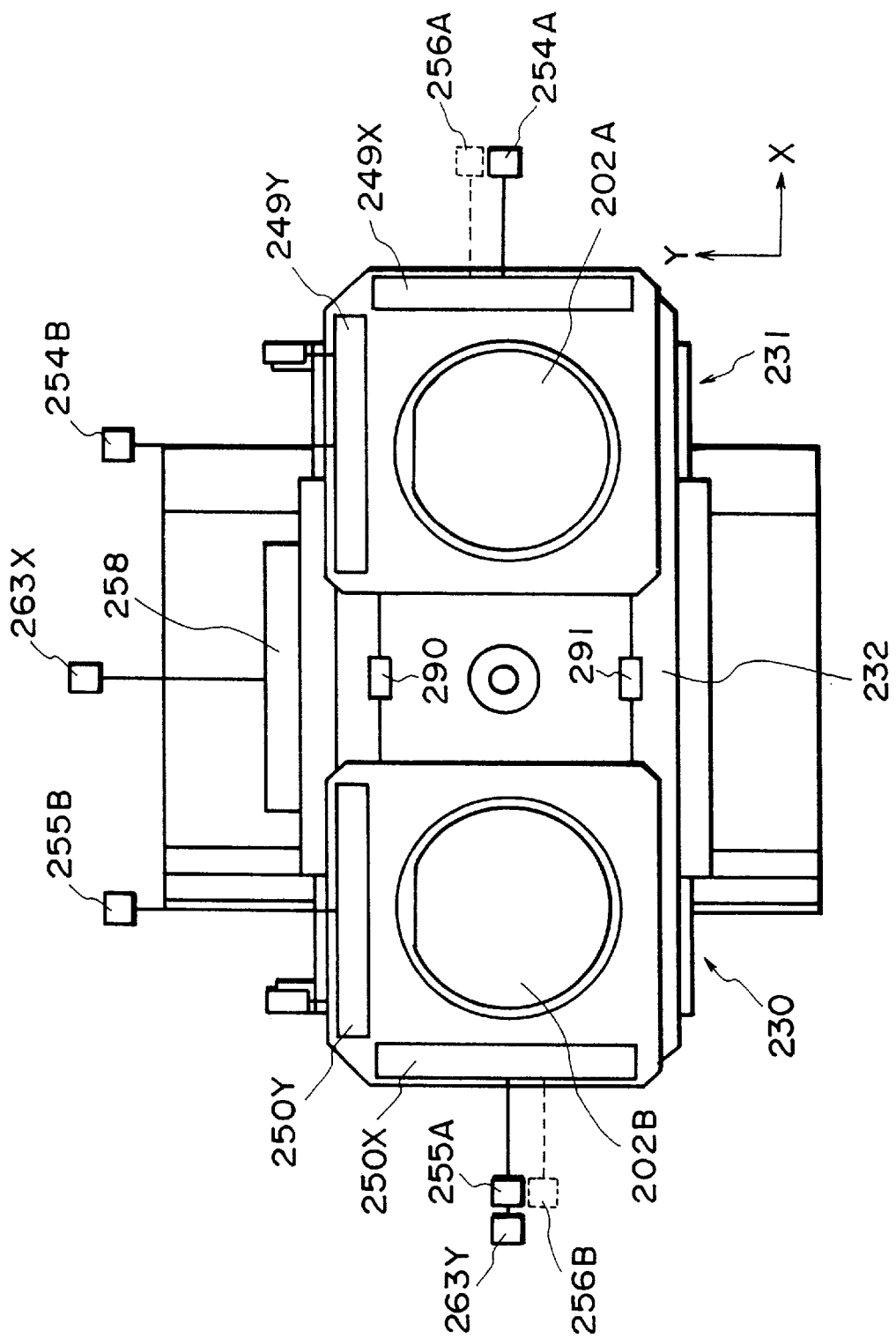
FIG. 13 is a front view, showing details of the FIG. 12 embodiment.
Figure 14:
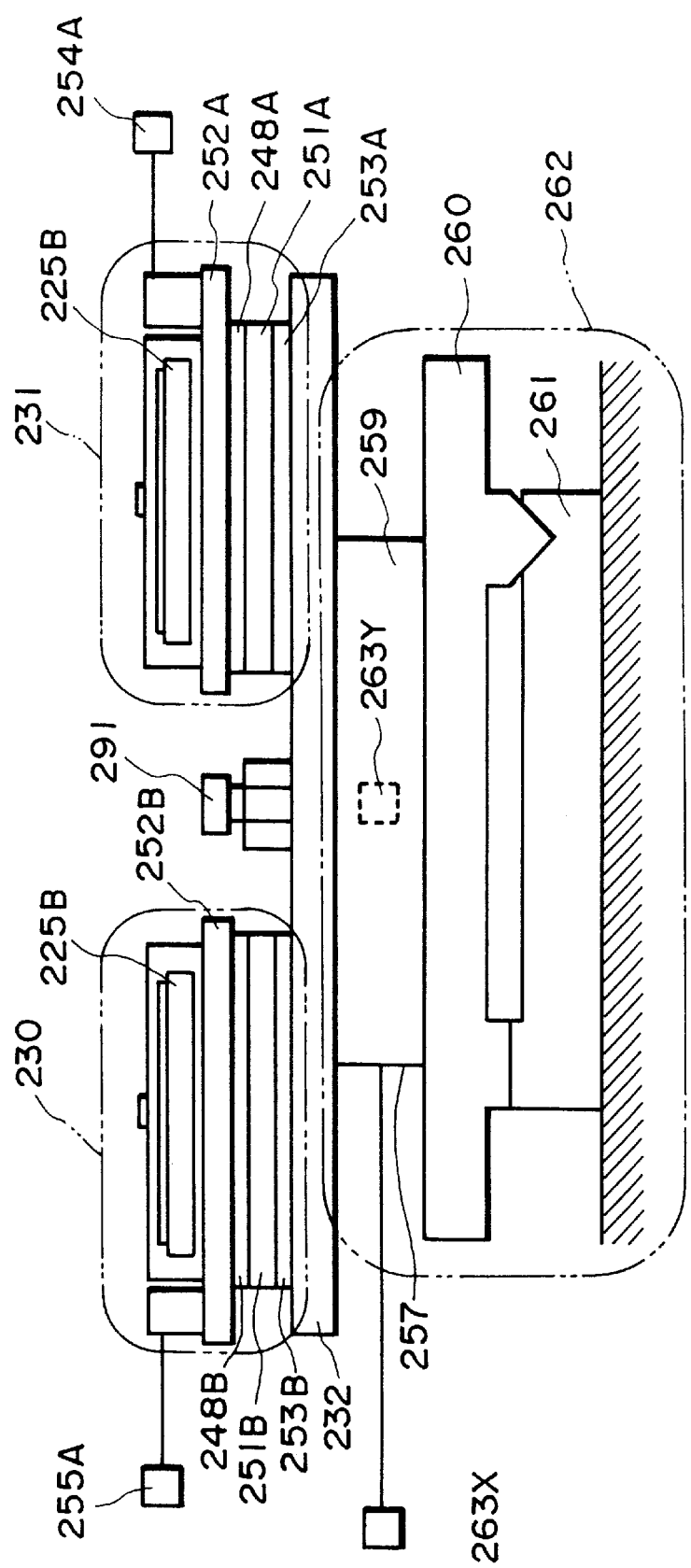
FIG. 14 is a side view, showing details of the FIG. 12 embodiment.

FIGS. 13 and 14 show details of the exposure stations 230 and 231 and the turntable 232. The substrate chucks 225A and 225B serve to attract and hold corresponding semiconductor substrates 202A and 202B, respectively, with flatness correction. The chucks 225A and 225B are mounted on leveling plates 252A and 252B, respectively. Also mounted on these leveling plates are reference mirrors 249X and 249Y; 250X and 250Y, for measuring the position with respect to the X-axis and Y-axis directions.

Z-axis driving mechanisms 248A and 248B serve to move corresponding leveling plates 252A and 252B in the Z-axis direction. Tilting mechanisms 251A and 251B each serves to bring the surface of a corresponding substrate 202 into coincidence with the image plane of the corresponding exposure system 211 or 222. Moving mechanisms 253A and 253B serve to move corresponding leveling plates 252A and 252B in the X, Y and θ directions. These components are mounted on the turntable 232 which is rotatable by 360 deg. in the horizontal (X-Y) plane about a rotational axis.

Position sensors 254A, 254B, 255A, 255B, 256A and 256B each may comprise a laser interferometer. These position sensors cooperate with corresponding reference mirrors 249X and 249Y; 250X and 250Y to measure the position of corresponding exposure stations 230 and 231 with respect to the X-axis, Y-axis and θ directions. An X stage 259 carries thereon the exposure stations 230 and 231, and it is movable along the X-axis direction. The X stage is mounted on a Y stage 260, and it is moved thereby in the Y-axis direction.

On the side surfaces of the X stage 259, reference mirrors 257 and 258 are provided for measurement of the position in the X and Y directions. These mirrors cooperate with laser interferometers 263X and 263Y to determine the X and Y coordinates of the X stage 259. The Y stage 260 is mounted on a stage plate 261 which is mounted on a base stage 262.

Now, the operation will be explained.

(1) After setting into the operative state, the partitions 228 and 236 are closed to keep the chamber 237 at a reduced pressure (vacuum). Also, the partition 227 is opened and the cassette 223 containing substrates 202 to be processed is introduced into the chamber 229. Then, the partition 227 is closed and the vacuum pump 243 is actuated to evacuate the inside of the chamber 229.

(2) Then, the partition 240 is opened and the cassette 238 for storing "processed" substrates 202 is introduced into the chamber 241. Then, the partition 240 is closed and the vacuum pump 45 is actuated to start evacuation of the inside of the chamber 241.

(3) When a similar vacuum level as in the chamber 229 is established in the chamber 237, the partition 228 is opened and a semiconductor substrate 202 in the cassette 223 is taken out by means of the conveying device 226. After prealigning it, the substrate is moved onto the chuck 225A of the exposure station 230 within the chamber 237.

(4) At this time, the exposure stations 230 and 231 are positioned at respective initial positions (X, Y, θ) through the adjustment using sensors 290 and 291 provided on the turntable 232. Simultaneously, the common stages 259 and 260 are moved to transfer the semiconductor substrate 202 from the conveying device 226 to the chuck 225A.

(5) The stages 259 and 260 whose positions are measured by the laser interferometers 263X and 263Y, move the exposure station 230 to a site below the first exposure system 211. The surface position of the substrate is measured by a focus measuring system 210 and, by displacing the exposure station 230, the surface of the substrate 202 is brought into coincidence with the image plane of the optical system 207 of the first exposure system 211.

(6) Then, while moving the stage, alignment marks of shot areas of the semiconductor substrate 202 are measured through an alignment measuring system 234. From measured values and from the stage positional information obtained through the laser interferometers 255A and 255B, the relative position of the substrate 202 with respect to the exposure system 211 is calculated. Then, a standard stage driving map as memorized in a memory (not shown) of the console 247 for the stepwise feeding of the stages 259 and 260, is corrected on the basis of the above calculation, and the corrected driving map is memorized again.

(7) On the basis of the thus corrected driving map, the stages 259 and 260 are moved so as to align the first shot area of the substrate 202. At the same time, by using the θ driving function of the moving mechanism 253B of the exposure station 230, the orientation of arrayed circuit patterns on the substrate 202 is adjusted to be aligned with the X-axis direction of the stage 259. When this is accomplished, the laser interferometers 255A, 255B and 256B are actuated to measure the position of the exposure station 230.

(8) After this, the leveling operation is effected for autofocusing or tilt correction. When the surface of the substrate 202 exactly coincides with the image plane position of the exposure system 211, the shutter 103 is actuated to effect the exposure of the first shot area.

(9) Again, the stages 259 and 260 are moved on the basis of the corrected driving map so as to move the second shot area to the site just below the exposure system 211, and the exposure process is executed in a similar manner.

(10) The operations at (9) are repeated until the last shot area of the substrate 202 is processed, whereby the exposure process to a first one of the semiconductor substrates 202 with the first exposure system 211 is completed. During this process, the outputs of the laser interferometers 255A, 255B and 256B monitoring of the position of the exposure station 230 are memorized as the date for each shot area. These laser interferometers are then deactuated.

(11) After this, the turntable 232 is rotated by 180 deg. to move the exposure station 231 to the site just below the first exposure system 211 and to move the exposure station 230 to the site just below the second exposure system 222. Simultaneously, the exposure stations 230 and 231 themselves are rotated by 180 deg. on the turntable 232.

(12) In a similar manner as the operation (3), a second semiconductor substrate 202 is placed and held on the chuck 225B of the exposure station 231.

(13) Then, the stages 259 and 260 move the exposure station 231 to the site just below the first exposure system 211. The surface position of the substrate is measured through the focus measuring system 210, and the exposure station 231 is displaced to bring the surface of the semiconductor substrate 202 into coincidence with the image plane position of the optical system 207 of the first exposure system 211. Since, at this time and as a matter of course, the first one of the semiconductor substrates 202 placed on the exposure station 230 is positioned just below the second exposure system 222, the autofocusing operation thereto may be made as desired. Generally, if the second exposure system 222 is a direct drawing system using an electron beam, such autofocusing is unnecessary since it has a large depth of focus.

(14) Then, while moving the exposure station 231 just under the first exposure system 211 by means of the stages 259 and 260, at different shot areas, those alignment marks of electronic circuit patterns as preparatively formed are measured by using the alignment measuring system 234. From the measured values and from the stage positional information obtained through the laser interferometers 255A, 2553 and 256B, the relative position of the substrate 202 with respect to the first exposure system 211 is calculated. Based on this calculation, a driving map memorized in the console beforehand for stepwise movement of the stages 259 and 260, is corrected. Also, since the position of the exposure station 230 is inverted and the positional information on the substrate 202 is changed, a corrected driving map is now prepared while taking into account the positional information of the substrate 202 on the exposure station 231.

(15) The stages 259 and 260 are moved to the first shot position of the semiconductor substrate on the exposure station 231. Here, since the exposure station 230 moves through the same motion, the substrate 202 on the exposure station 230 is similarly positioned to its first shot position. Since however the stages 259 and 260 are movable only along the X and Y directions, the running direction or a deviation from the driving map may be corrected through the X, Y and θ driving mechanism 251A of the exposure station 230. Then, the laser interferometers of the exposure stations 230 and 231 are actuated.

(16) After this, the focus adjustment of the first exposure system 211 is executed and, thereafter, the shutter 230 of the first exposure system 211 is actuated to execute the exposure of the first shot area. Simultaneously, under the second exposure system 222, the direct drawing to first shot area is executed on the basis of the information of the corrected driving map as well as the information of the circuit pattern as memorized in the console 247. In this case, however, for the direct drawing the second exposure system 222 moves the exposure station 230 while controlling the movement through the laser interferometers 254A, 254B and 256A, to execute sequential drawing to required portions of that shot area. After completion of the drawing in that shot area, the exposure station 230 is moved back to its initial position by using the laser interferometers 254A, 2543 and 256A.

(17) The stages 259 and 260 are moved to move the substrate to the second shot position and, by using the exposure systems 211 and 222, the exposure and direct drawing process is executed in a similar manner as the operation (16). Such step-and-repeat operation is effected repeatedly until the exposure and direct drawing process to the last shot area of the substrate 202 is completed.

(18) As the exposure and direct drawing process to the last shot area of each substrate is accomplished, the partition 236 is opened and the "processed" substrate on the exposure station 230 is off-loaded by using the conveying device 239 and is stored into the cassette 238. Here, when the partition 236 is going to be opened, it is necessary to check beforehand whether the chamber 241 is at a reduced pressure (vacuum). Then, the laser interferometers of the exposure stations 230 and 231 are deactuated.

(19) After this, the operations (11)–(18) are repeated. Aster the processing of the last substrate (wafer) is completed, the partitions 227 and 236 are closed while, on the other hand, the partitions 227 and 240 are then openable/closable, thus allowing off-loading/introduction of the cassette containing the substrates.

Figure 15:
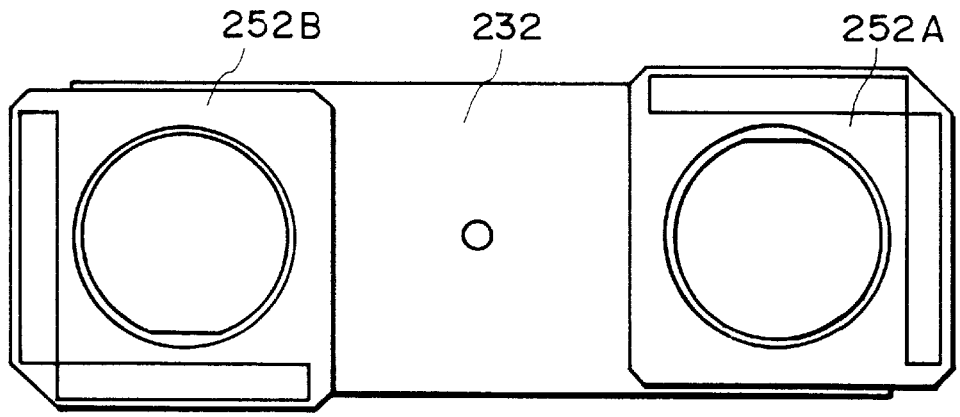
FIG. 15 is a front view, showing details of a further embodiment of the present invention.

In this embodiment, in the operations following the operation (11), when the turntable 232 is rotated by 180 deg., the exposure stations 230 and 231 themselves are also rotated by 180 deg. However, if the exposure stations 230 and 231 each has a large stroke in the X and Y directions to allow the exposure or direct drawing of the whole surface of a wafer, then the exposure stations themselves may not be rotated, such as illustrated in FIG. 15.

Further, if the direct drawing with the second exposure system 222 is made in order from the last shot area to the first shot area, then each exposure station may not necessarily have a large stroke in the X and Y directions for allowing the exposure or drawing to the whole surface of a wafer.

Further, if in this embodiment the components denoted at 226 and 239 are bi-directional conveying systems of loading/unloading type and the components denoted at 223 and 238 are respective supplying and containing cassettes, then the following operation is possible. On that occasion, as shown in FIG. 15, the exposure stations 230 and 231 themselves may not necessarily be rotated by 180 deg.

(1) By using the conveying systems 226 and 239, semiconductor substrates 202 are taken out of the common cassettes 223 and 238, and then the prealigned substrates are placed and held on the chucks 225A and 225B, respectively, of the exposure stations 230 and 231, respectively.

(2) The stages 259 and 260 are moved and, just is below the exposure systems 211 and 222, the autofocusing operation is executed. At each of the exposure systems 211 and 222, position measurement is effected to plural shot ares.

(3) On the basis of the measured values obtained with the exposure systems 211 and 222, the respective exposure stations 230 and 231 are moved to align the respective measurement references (optical axes) with the positions of the respective substrates, and the moving direction of the stages 259 and 260 is brought into alignment with the array direction of circuit patterns on the substrate.

(4) Also, the driving map for the running of the stages 259 and 260 is corrected on the basis of the measured values, and a position correcting table for each exposure station is prepared and memorized.

(5) The stages 259 and 260 are moved to the first shot position of the first exposure system 211 and, after completion of the autofocusing operation, the exposure operation is executed. At the same time, under the second exposure system 222, the direct drawing process starts from the position corresponding to the last shot areas of the substrate.

(6) The stages 259 and 260 are moved sequentially to complete the exposure of the drawing of all the shot areas of the substrate 202.

(7) As the processing to the whole surface of each of the substrates, with the exposure systems 211 and 222, is completed, the turntable 232 is rotated by 180 deg. At this time, the substrate 202 moved to the site just below the first exposure system 211 has only ultra-fine patterns formed by the drawing, and the substrate 202 moved to the site just below the second exposure system 222 has all the circuit patterns except the ultra-fine patterns.

(8) Under this situation, the moving directions of the stages 259 and 260 as well as the array directions of the substrates on the exposure stations 230 and 231 are changed. However, by using corresponding position sensors 254A, 254B, 255A, 255B, 256A and 256B of the exposure stations 230 and 231, the position of each circuit pattern can be aligned with the reference of a corresponding exposure system 211 or 222. Then, the operations (2)–(6) are repeated, and the processing of the substrates below the exposure systems is completed simultaneously.

(9) The conveying systems 226 and 239 are actuated and the substrates 202 on the exposure stations 230 and 231 are stored into the cassettes 223 and 238, respectively. Here, the substrate 202 having been taken out of the cassettes 223 is stored into the cassette 238 while the substrate 202 having been taken out of the cassette 238 is stored into the cassette 223. However, at the time when the processing of all the substrates is completed, only the cassettes are exchanged, and there is no problem.

In this example, all the processing operations are executed in parallel. Thus, it is most effective with respect to productivity. It is to be noted that in this example use of a laser interferometer for the measurement and control of the position of the exposure station is not always necessary. This is very advantageous with respect to the cost While the above embodiment has been described with reference to an example wherein the first exposure system 211 is provided by an optical exposure system having a reduction projection optical system and the second exposure system 222 is provided by an electron beam direct drawing system, the invention is not limited to the combination of these types of exposure systems.

Further, while the above embodiment has two exposure systems, if the processing performances of the first and second exposure systems 211 and 222 are unbalanced, an increased number of exposure systems may be used for the first or second exposure system, for attaining the balancing.

As an example, when the first exposure system uses a reduction projection optical system while the second exposure system comprises an electron beam exposure system, generally the first exposure system has a substrate processing performance of 1–5 sec. per one shot (50 shots for each 6 inch wafer). When an electron beam system is used to execute the direct drawing to the whole surface of a 6 inch wafer, usually it takes 10–20 min. per each wafer, although it depends on the sensitivity of a photoresist used.

If the direct drawing is made only with respect to an ultra-fine circuit pattern, as in the above-described embodiment, it needs about 3–15 sec. per one shot. Thus, using two or three electron beam exposure systems as the "second exposure system" will assure satisfactory results.

Figure 16:
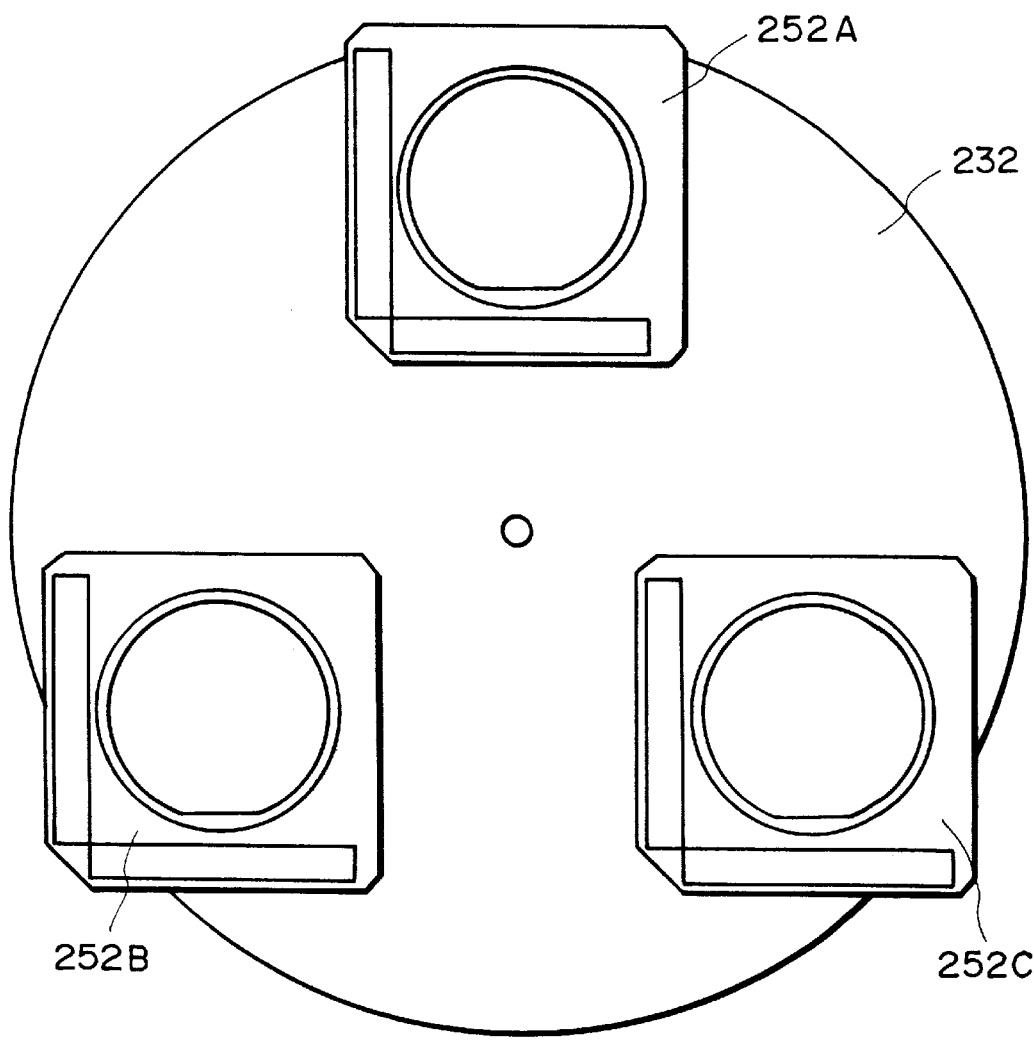
FIG. 16 is a front view, showing details of a still further embodiment of the present invention.

It a plurality of "second" exposure systems are used such as shown in FIG. 16, it is possible to use the first exposure system for transferring a relatively rough circuit pattern, to use one of the second exposure systems for drawing a fine circuit pattern portion, and to use another second exposure system for drawing an ultra-fine circuit pattern portion.

It is a further alternative to use the first exposure system for transferring a fine circuit pattern while using the second exposure system for drawing an ultra-fine circuit pattern and, if the second exposure system has a higher processing ability than that of the first exposure system, a portion of such a pattern which might be processed by the first exposure system may be processed by the drawing through the second exposure system. This increases the registration precision of the circuit pattern.

In accordance with some embodiments of the present invention, as have been described hereinbefore, exposure systems of different performances and specifications are incorporated into one and the same apparatus while retaining their advantageous features, and substrates are made interchangeable between these exposure systems. Also, they are moved by a common stage. Therefore, it is possible to compensate for disadvantages which are involved in respective. exposure systems.

Further, in an electron beam direct drawing system, the drawing speed is low. In some embodiments of the present invention, however, such an electron beam direct drawing system is used only for the drawing of a portion of a semiconductor circuit pattern. As a result, the slow drawing speed can be compensated for while, on the other hand, the mass production of semiconductor devices each having a very fine pattern which might not be resolved by an optical exposure system, is assured.

If different exposure systems are used separately to execute the exposure process of the same semiconductor substrate, a large number of substrate handling operations are necessary to transfer the substrate between these exposure systems. This directly leads to the problem of contamination. In some embodiments of the present invention, at least two exposure systems are disposed in juxtaposition within one and the same apparatus to make the length of the substrate conveyance path minimum. Also, all the the substrate processing is effected within a vacuum chamber. By this, the problem of contamination can be avoided.

While the invention has been described with reference to the structures disclosed herein, it is not confined to the details set forth and this application is intended to cover such modifications or changes as may come within the purposes of the improvements or the scope of the following claims.

What is claimed is:

1. A semiconductor device manufacturing apparatus for exposing substrates with radiation, each substrate having a plurality of shot regions, said apparatus comprising:

a first exposure system comprising an illumination optical system for illuminating a reticle having a pattern, and a projection optical system for projecting the pattern of the reticle onto one of the shot regions of a substrate;

a second exposure system separate from said first exposure system, said second exposure system comprising one of an electron beam exposure system, a synchrotron radiation exposure system, an X-ray exposure system, an ion beam exposure system and a laser beam exposure system;

a main structural member, comprising a chamber, for supporting said first and second exposure systems as a unit;

a plurality of exposure stations disposed in said chamber, each exposure station including a substrate chuck for supporting a substrate, a movable stage for moving said substrate chuck at least two-dimensionally, and a laser interferometer, comprising a mirror, for measuring the position of said movable stage, wherein, when one of said plurality of exposure stations is used in association with said first exposure system, another exposure station is able to be used in association with said second exposure system;

a base table, disposed in said chamber, for supporting said plurality of exposure stations, said base table being movable to change said plurality of exposure stations between said first and second exposure systems;

an anti-vibration system for supporting said main structural member, wherein said first and second exposure systems are supported by said anti-vibration system through said main structural member; and a controller for controlling said movable stages and a common stage mechanism on the basis of outputs of said interferometers, said controller controlling said common stage mechanism to stepwisely move substrates held by said substrate chucks simultaneously so that, at each exposure station, one of the shot regions of a substrate is positioned with respect to an exposure position of a respective exposure station, and subsequently controlling positions of said movable stages independently of each other to position the substrates so that said first and second exposure systems can perform exposure operations.

2. An apparatus according to claim 1, wherein said first and second exposure systems use the same type of photosensitive materials.

3. An apparatus according to claim 1, wherein said illumination optical exposure system comprises one of a deep ultraviolet light source, and an excimer laser light source.

4. An apparatus according to claim 1, wherein said second exposure system uses a beam having a size equal to or smaller than the minimum linewidth of the circuit pattern to be formed on the semiconductor substrate.

5. An apparatus according to claim 1, wherein at least one of said first and second exposure systems comprises a vacuum chamber for processing the substrate within a vacuum.

6. An apparatus according to claim 1, further comprising a substrate processing vacuum chamber which is provided in common to said first and second exposure systems.

7. An apparatus according to claim 5, wherein said vacuum member accommodates therein at least a portion of one of said first and second exposure systems.

8. An apparatus according to claim 6, wherein said vacuum chamber accommodates therein at least a portion of each of said first and second exposure systems.

9. An apparatus according to claim 5, wherein said first and second exposure systems comprises separate stages, respectively, for moving and positioning respective semiconductor substrates independently of each other.

10. An apparatus according to claim 9, further comprising measuring means common to said first and second exposure systems, wherein respective stages of said first and second exposure systems have positional coordinates which are interrelated through said measuring means.

11. An apparatus according to claim 5, wherein said first exposure system and a first stage for moving and positioning a semiconductor substrate are disposed in atmosphere, a second stage for moving and positioning a substrate related to said second exposure system is disposed in a vacuum chamber, and a chamber having an openable and closable partition and having an inside which can be maintained at a vacuum is provided between said vacuum chambers of said first and second exposure systems.

12. An apparatus according to claim 6, wherein separate stages each for moving and positioning a semiconductor substrate are provided in relation to said first and second exposure systems, independently of each other.

13. An apparatus according to claim 12, wherein said stages of said first and second exposure systems have positional coordinates which are interrelated through one of a common and separate measuring means.

14. An apparatus according to claim 6, further comprising a stage for moving and positioning the semiconductor substrate, wherein said stage comprises a common stage member having a stroke for covering the exposure ranges of said first and second exposure systems, and a chuck, mounted on said common stage, for fixedly holding the substrate, and further comprising a positioning mechanism for bringing the surface of the substrate into coincidence with an image plane of each of said first and second exposure systems.

15. An apparatus according to claim 1, further comprising a chamber for surrounding at least said exposure stations with a reduced pressure ambience.

16. An apparatus according to claim 15, wherein one of said exposure systems comprises an optical reduction projection exposure system and another exposure system comprises an electron beam exposure system.

17. An apparatus according to claim 1, further comprising a plurality of said second exposure systems, each being supported by said main structural member.

* * * * *

UNITED STATES PATENT AND TRADEMARK OFFICE
CERTIFICATE OF CORRECTION

PATENT NO. : 6,023,068

DATED : February 8, 2000

INVENTOR(S): KAZUO TAKAHASHI  Page 1 of 2

It is certified that error appears in the above-identified patent and that said Letters Patent is hereby corrected as shown below:

ON THE COVER PAGE:
Following "*Attorney, Agent, or Firm*", "Fitxpstrick, Cella, Harper & Scinto" should read --Fitzpatrick, Cella, Harper & Scinto--.

IN THE DISCLOSURE:
COLUMN 6:
Line 63, "station:" should read --station;--.

COLUMN 7:
Line 48, "an" should read --a--, and "and a" should read --and an--.

COLUMN 10:
Line 46, "to" should read --for--, and "has" should read --has been--.

COLUMN 12:
Line 55, "is" should read --are--.

COLUMN 13:
Line 56, "serves" should read --serve--.

UNITED STATES PATENT AND TRADEMARK OFFICE
CERTIFICATE OF CORRECTION

PATENT NO. : 6,023,068

DATED : February 8, 2000

INVENTOR(S): KAZUO TAKAHASHI

It is certified that error appears in the above-identified patent and that said Letters Patent is hereby corrected as shown below:

COLUMN 16:
Line 34, "Aster" should read --After--.

COLUMN 17:
Line 2, "ares." should read --areas.--; and
Line 56, "cost" should read --cost.--.

COLUMN 18:
Line 17, "It" should read --If--.

COLUMN 20:
Line 14, "comprises" should read --comprise--.

Signed and Sealed this

Twentieth Day of February, 2001

Attest:

NICHOLAS P. GODICI

Attesting Officer

Acting Director of the United States Patent and Trademark Office